United States Patent [19]

Kuurstra

[11] Patent Number: 4,839,600
[45] Date of Patent: Jun. 13, 1989

[54] AMMETER FOR USE WITH A.C. ELECTRIC POWER LINES

[76] Inventor: John C. Kuurstra, 40 Johnson Street, Thornhill, Ontario, Canada, L3T 2N7

[21] Appl. No.: 26,601

[22] Filed: Mar. 17, 1987

Related U.S. Application Data

[63] Continuation-in-part of Ser. No. 817,708, Jan. 10, 1986, abandoned.

[51] Int. Cl.⁴ .................... G01R 11/02; G01R 11/04
[52] U.S. Cl. ........................... 324/127; 324/117 R; 324/129; 336/175
[58] Field of Search ............... 324/127, 129, 149, 142, 324/117 R, 117 H; 336/174–176

[56] References Cited

U.S. PATENT DOCUMENTS

| | | | |
|---|---|---|---|
| Re. 20,290 | 3/1937 | Stanton | 324/129 |
| 1,569,723 | 1/1926 | Dickinson | 336/176 |
| 2,295,959 | 9/1942 | Melville et al. | 324/129 |
| 2,375,591 | 5/1945 | Schweitzer, Jr. | 324/127 |
| 3,102,988 | 9/1963 | Hoffman | 324/127 |
| 3,253,215 | 5/1966 | Moakler et al. | 324/127 |
| 3,277,368 | 10/1966 | Schweitzer, Jr. | 324/127 |
| 3,386,032 | 5/1968 | Medlar | 324/127 |
| 3,453,544 | 7/1969 | Schweitzer, Jr. | 324/127 |
| 3,633,101 | 1/1972 | Johnson | 324/102 |
| 3,984,798 | 10/1976 | Bussen | 324/127 |
| 4,005,380 | 1/1977 | Heilmann et al. | 324/127 |
| 4,234,863 | 11/1980 | Shumway et al. | 324/127 |
| 4,378,525 | 3/1983 | Burdick | 324/117 R |
| 4,454,557 | 6/1984 | Hurley | 324/127 |
| 4,620,151 | 10/1986 | Landre | 324/127 |

FOREIGN PATENT DOCUMENTS 0368266 2/1939 Italy .................... 324/127

Primary Examiner—Reinhard J. Eisenzopf
Assistant Examiner—W. Burns
Attorney, Agent, or Firm—Rogers & Scott

[57] ABSTRACT

The invention provides an ammeter specially suited for measuring the currents passing in high voltage, high power A.C. lines and, when required, storage of the resultant information, together with time of day and date over an extended period of time. The ammeter employs two C-shaped cores defining between two of the core arms a relatively large permanent gap that can pass the power line to facilitate mounting on the line using a live-line stick. One embodiment intended for mounting for an extended period of time also employs a clamp that can be manipulated using the stick to clamp it to the line and unclamp it, the clamp and core being related so that the power line passes through the center of the space between the cores. An embodiment intended for "spot" measurements has a locating member that performs the same function. A third device has the locating member in two parts that pivot to enable a large power conductor to pass through the slot in the locating member to the closed locating end thereof. The devices may be characterized as "current transducers" and the two cores carry respective coils that are oppositely wound on the core arms opposite to one another. The A.C. signal from the coils is converted to a digital signal and is fed to an external display and/or is recorded in a non-volatile memory together with the time and date data using a microcomputer that is powered only during the short interval required for measuring, thus conserving battery power.

11 Claims, 8 Drawing Sheets

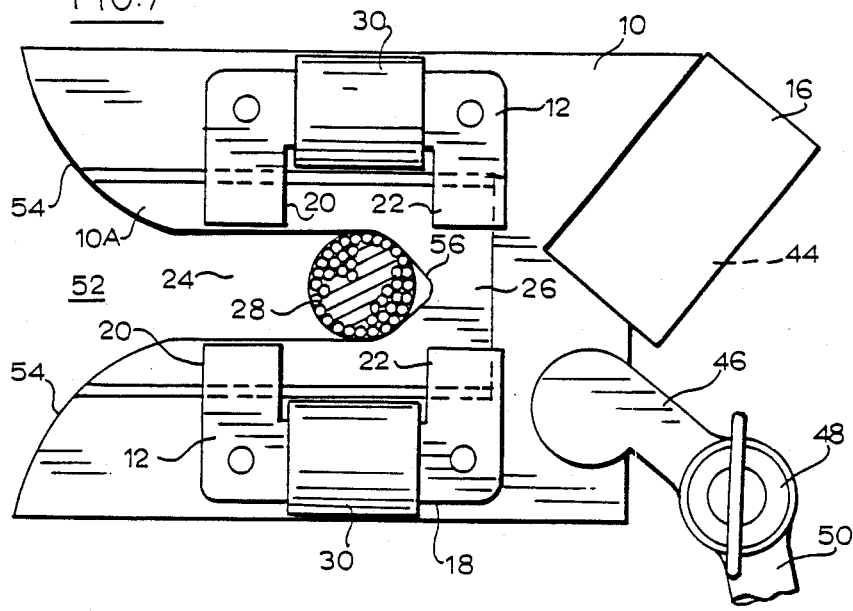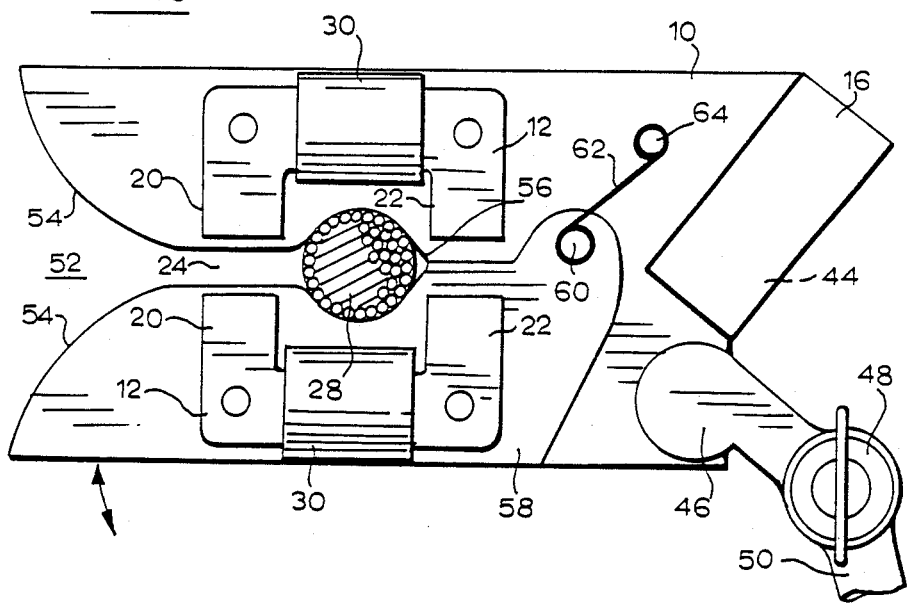

AMMETER FOR USE WITH A.C. ELECTRIC POWER LINES

CROSS REFERENCE TO RELATED APPLICATIONS

This application is a continuation-in-part of my prior U.S. patent application Ser. No. 06/817,708, filed Jan. 10, 1986, now abandoned.

FIELD OF THE INVENTION

The invention is concerned with improvements in or relating to ammeters for attachment to A.C. electric power lines for measurement of the current passing through the power lines, and particularly to such an ammeter which will permit on-line recording of the current passing through the line over a period of time.

REVIEW OF THE PRIOR ART

There is a continuing need in power systems practice to provide accurate information as to the distribution of line loading in various power lines, since such information is required for decisions regarding distribution, new installations and load transfer. This information normally is obtained by the use of portable or permanently installed recording ammeters consisting of at least one insulated current transformer which is clipped onto the line under investigation and is connected to a recorder. Such apparatus involves significant operational, reliability and safety problems, especially with higher power lines e.g. 27.6 kV and 44 kV, owing to the difficulty of ensuring safety in installation and removal and maintenance of adequate insulation during use.

Ammeters of the so-called snap-on type are well known consisting of a hinged core, the jaws of which are opened to provide a gap wide enough for it to be snapped onto the power line whose current flow is to be measured, the jaws being held closed by a spring to ensure that it constitutes a substantially continuous magnetic loop permitting the current to be measured without substantial error irrespective of the position of the ammeter on the power line. The use of such ammeters becomes extremely difficult with high power lines owing to their weight and the mechanical difficulty of manipulating the movable jaws while installing the device and removing it from the line, and also the problems inherent with the high voltages involved. Examples of such split core transformer ammeters are disclosed in U.S. Pat. Nos. 2,295,959, 3,102,988 and 3,984,798.

Current transformer measuring apparatus which avoids the need for such a split core is disclosed in U.S. Pat. No. 2,375,591 to E. O. Schweitzer, Jr., his apparatus typically employing two C-shaped core members which are clamped together with joining sections between them to form a single core having a single gap; a single winding is mounted on the core for connection to external measuring apparatus. In one embodiment the core has a special configuration that permits the device to be mounted on the line by lifting it vertically until the core extends on opposite sides of the line, and then rotating the device about the vertical axis through 90 degrees. Schweitzer, Jr. is concerned to minimize the effect of this very large single gap on the reluctance of the core.

DEFINITION OF THE INVENTION

It is therefore a principal object of the invention to provide a new ammeter particularly adapted for attachment to an A.C. electric power line for measurement of the current passing in the power line.

It is a more specific object to provide a recording ammeter which can readily be attached to an A.C. power line and will record the current passing in the line for a substantial period of time.

In accordance with the present invention there is provided an ammeter for mounting on an A.C. electric power line for measurement of the current passing in the power line, the apparatus comprising:

(a) a support member;

(b) two at least approximately C-shaped flux-concentrating magnetic cores each comprising a base portion and two arm portions mounted oppositely to one another on the support member, the cores being separated at all times from one another to provide a power line receiving air gap between them with corresponding arm portions thereof disposed opposite to one another to define between the said oppositely disposed arm portions two respective opposed separate permanent non-magnetic gaps through one of which the power line passes while mounting the ammeter on and dismounting the ammeter from the power line;

(c) at least two opposed multi-turn inductive coils wound respectively on the cores and connected in series with one another;

(d) measuring means connected to the said coils for measuring directly the current flowing therein, thereby obtaining a measurement representative of the current passing in the power line; and (e) means for locating the line within the power line receiving space at least approximately centrally between the two cores.

For a recording ammeter intended to be left in position for an extended period of time, the said means for locating the line comprise clamp means on the support member adapted to engage the power line and to clamp to the power line with the power line in position passing through the power line receiving space between the two cores.

Preferably the clamp means is clamped to and unclamped from the power line by movement of an operating member having a loop for engagement by a live-line hook stick for an operator to effect the said movement.

For an ammeter intended for spot measurements, the said means for locating the line comprise a closed-end slot within the support member and into which the line is passed to mount the ammeter on the line, the closed end of the slot being disposed at least approximately centrally between the two cores.

The apparatus may include current measuring and recording means mounted on the support member and electrically connected to the coils.

The apparatus may also include means for powering up the current measuring means for successive measuring periods spaced from one another by respective predetermined non-measuring intervals, and for powering down the current measuring means during the said non-measuring intervals, and for powering up the recording means during both the said non-measuring intervals and the said measuring periods.

DESCRIPTION OF THE DRAWINGS

Electronic recording ammeters which are particular preferred embodiments of the invention will now be described, by way of example, with reference to the accompanying diagrammatic drawings, wherein:

FIG. 7 is a side elevation view of a second embodiment of the apparatus, intended for manual mounting on the A.C. power line; and FIG. 8 is a side elevation of a third embodiment of the apparatus, intended for mounting on a large diameter power line.

DESCRIPTION OF THE PREFERRED EMBODIMENTS

Figure 1:
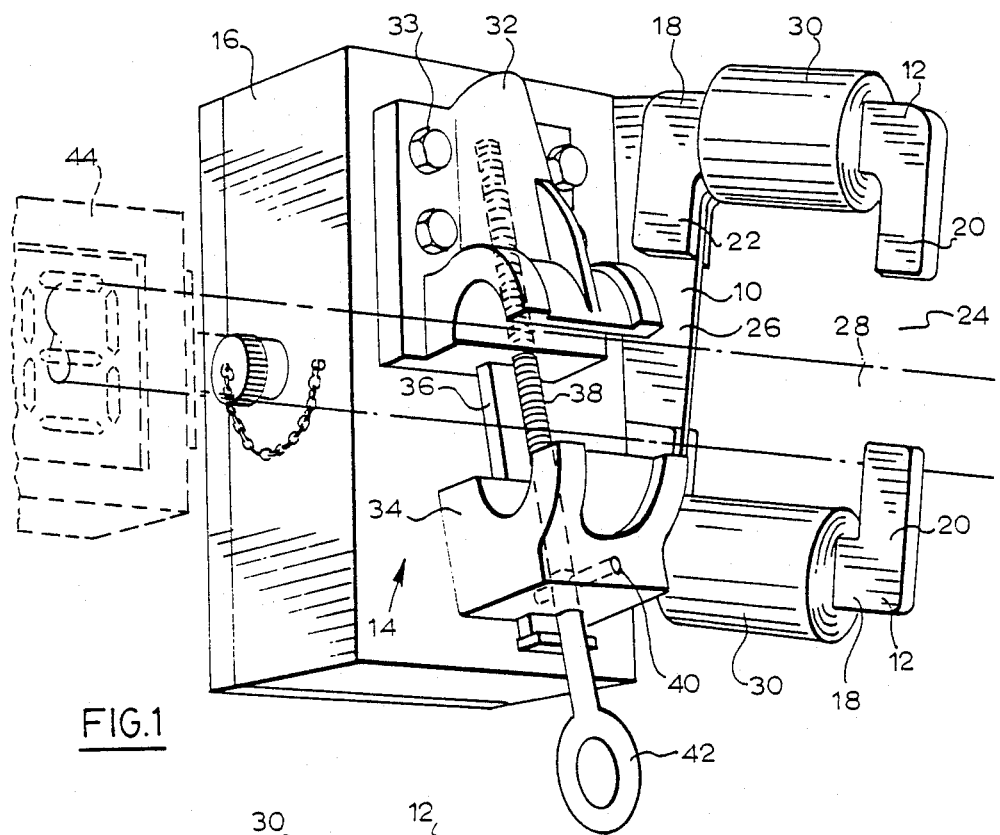
FIG. 1 is a perspective view of a first embodiment of the apparatus intended for mounting on an A.C. power line for extended periods, and showing it mounted on a power line.
Figure 2:
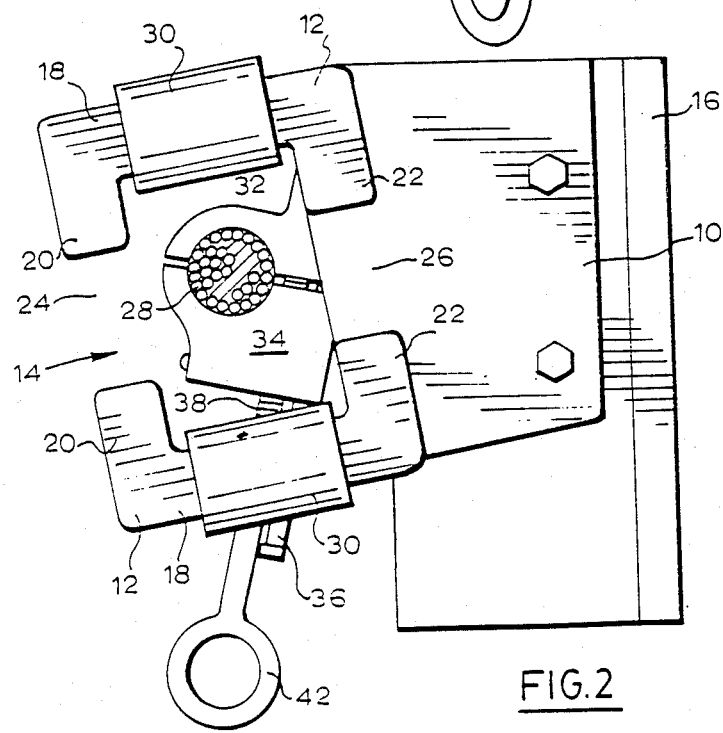
FIG. 2 is a side elevation view of the apparatus of FIG. 1.

Referring now to FIGS. 1 and 2, the ammeter comprises a support member consisting of a plate 10 of non-magnetic material, such as aluminum, to which is fastened two opposed C-shaped cores 12 of high permeability material, a clamp 14 and a non-magnetic, weather-proof container 16 for the electronic circuit. In the embodiment illustrated each core 12 has a longer base side 18 and two shorter arm sides 20 and 22. The cores are securely attached to the support member 10 oppositely to one another, so that two of the shorter opposed arm sides 20 together define a substantial permanent gap 24 large enough to permit the passage therethrough of the largest diameter power line 28 with which the ammeter is intended to be used. The other shorter arm sides 22 together define a similar permanent gap 26 directly opposite to the gap 24. The two base sides 18 each has mounted thereon a multi-turn inductive coil 30, the two coils being connected in series with one another and oppositely wound. In a specific embodiment each of these coils consists of approximately 10,000 turns of AWG 36 wire. In a commercial embodiment at least the cores and coils are enclosed by a protective coating, which is omitted in the attached drawings in the interest of clarity of illustration. The coils are connected to the electronic circuit as will be described below.

The clamp 14 of this embodiment consists of a fixed portion 32 which is rigidly secured by bolts 33 to the enclosure 16, and thus to the support member 10, and comprises the fixed jaw of the clamp. The movable jaw of the clamp consists of a movable member 34 guided for movement to and away from the fixed jaw member by a guideway 36 and moved towards and away from the fixed jaw member by a screw-threaded rod 38 which is rotatable about its longitudinal axis while anchored in the movable member against longitudinal movement by a pin 40, the rod being screw-threaded into a suitable screw-threaded recess in the fixed portion 32. The rotatable rod has at its free end a loop 42 which can readily be engaged by the standard live-line hooked stick used, for example, by line servicemen for fuse manipulation, the engagement permitting the device to be picked up and hoisted into position on the line, and thereafter the rod rotated to close the clamp on the line. The clamp member and the magnetic cores 12 are so mounted relative to each other by the support member that, with the clamp firmly clamped onto the power line 28, the line passes at least approximately through the magnetic and geometric centers of the two cores. Thus, the current measured by the device is least sensitive to variations in the position of the conductor when the conductor is placed at the center of the rectangle defined by the two cores. Since it is desired to be able to use each device with power lines of a range of different diameters, and a fixed jaw clamp is used in this embodiment, exact concentricity will only be obtained for a power line of one specific diameter. However, any small displacements of the centre of the conductor involved in its use with power lines of different diameters does not cause any unacceptable error. In a specific embodiment the clamp has been positioned such that the center of a clamped conductor having a diameter of 15.8 mm (0.625 inches) is approximately at the center of the rectangle.

In operation, the device is picked up using the live-line stick and positioned on the power line to be investigated by maneuvering until the fixed portion of the clamp rests on the line. The line stick is now rotated, thereby rotating the screw member until the clamp has been clamped onto the power line, the device also being rotated about the longitudinal axis of the line until the core and its windings is in the desired relationship to the line and to adjacent parallel lines, as will be discussed below. The clamp is then finally tightened onto the line and will hold the ammeter securely in place for as long as is required, while the associated circuitry to be described below measures the current passing in the line and stores the information in the memory provided therein.

It is also possible to provide the ammeter with measuring means constituted by a display device, consisting of, for example, a relatively large size LCD display 44, shown in broken lines in FIG. 1, that will display the current value measured by the device in a manner that it can be read from the ground. Such an arrangement permits spot checks to be made of the current flow, but usually is not more generally used, since the battery consumption of the display is relatively high compared to the remainder of the circuitry and it cannot therefore be left in position for as long periods as when the device is storing the information in the manner to be described.

It is further possible to provide the ammeter with measuring means comprising a low-power transmitter that will transmit signals representative of the measured values to a nearby receiver for storage, or more usually for transmission by telephone line to a central monitoring station. The use of such a transmitter/receiver link has the advantage of providing isolation of the line-mounted ammeter from the telephone system used to transmit the information.

As described above, most of the prior art devices proposed hitherto require the magnetic ore or cores to have the parts thereof fitted tightly together with the minimum possible gap or gaps, U.S. Pat. No. 2,375,591 of Schweitzer, Jr. disclosing a device with a single permanent gap that is relatively large, and Schweitzer is concerned to minimize the effect of this large air gap. In a current transformer it is necessary to provide a low reluctance path around the core for the magnetic flux and therefore no gap, or at most only the very narrow gap produced by the cores touching is preferred, to avoid saturation and ensure a sufficient flow of flux to induce enough current in the secondary winding. In the unsaturated condition the current induced in the secondary winding is a good replica of the primary current, with its value directly related to that in the primary current line by the turn ratio between them, as is conventional. The secondary winding and its shunt (i.e. the meter) are designed to have as low an input resistance as possible, so as not to unduly load the secondary winding and ensure accuracy.

The devices of the present invention are more accurately regarded as current transducers. The cores in the special configuration characteristic of the invention, namely two C-shaped cores permanently mounted with fixed air gaps to allow a conductor to enter readily between the cores, have the cores acting as "flux concentrators". Thus, the device is permeated by the flux generated by the power line current flowing in the power line on which it is mounted and, owing to the low permeability of the air gaps between the cores, the flux that would be incident on the gaps flows preferably through the nearest core to be concentrated therein. This is to be contrasted with the prior art split core devices where the gap must be made virtually zero to enable the flux to circulate in the core across the gap. It is found that once substantial gaps are present between the core ends there is relatively little effect on the accuracy of the device in varying the size of the gaps over quite a wide range. This line current flux induces a relatively small amount of flux in the cores, but this induces a satisfactorily measurable current in the multiturn coils that are wound around the cores. As will be described below, care is taken with the devices of the invention to avoid errors due to unequal flows of flux in the two flux concentrators, and to this end the two gaps 24 and 26 are preferably of equal width, even though only the gap 24 through which the line 28 passes needs to be physically wide enough for the line to pass easily therethrough.

FIG. 7 shows in side elevation a second embodiment that will permit rapid measurement of the current passing through a line 28 when "spot" measurements of this kind are required, without the need to clamp the ammeter to the line. The same references are used for similar parts whenever possible. The support 10 has a container 16 fastened thereto which may contain a recorder and/or transmitter and/or may incorporate a visual display 44 of a size to be read from the ground. The support also has a protruding arm 46 to which is fastened by a pivot joint 48 an insulated stick 50 by which the ammeter is lifted and placed on the line whose current is to be measured. The joint 48 allows for adjustment of the inclination of the device to the stick to minimize errors, and ensure that the visual display device, when provided, can easily be read from below. The aluminum support 10 is provided with a front-opening, closed-rear-end slot 52 having convex, converging, leading edges 54, the part of the slot between the core arms 20 being of the same height as the gap 24. The length of the slot 54 is such that when the line 28 is pressed firmly against its closed end 56 it is positioned accurately centered between the two cores 12. The center portion 10A of the support 10 in which the slot is formed is made removable from the remainder of the support, so that the same instrument can be used with different diameters of line 28 by providing respective center portions 10A with respective slots of the required height and length for the corresponding line diameter.

FIG. 8 shows in side elevation a third embodiment intended primarily for use with large diameter power lines which would result in gaps 24 that are larger than is desirable. To this end the lower part 58 of the base plate 10 is pivoted at 60 to the remainder of the plate and urged to the closed position of minimum size shown in FIG. 8 by a coil spring 62 around the pivot 60 with its end engaging a stop 64. Thus, as the device is pressed against the power line the jaws 54 of the slot can open to pass the line 28 through the smaller part of the slot adjacent to the enlarged end 56 until it reaches the enlarged closed slot end 56 when the jaws are again closed by the spring while the power line is positioned accurately centrally, as with the two previously described embodiments. The jaw again opens when the device is withdrawn from the line.

Although these embodiments are intended primarily for spot measurements, and consequently employ a visual display, they will also with advantage include means for recording the values measured together with time, date, etc., so that a permanent record is also provided.

Figure 3A:
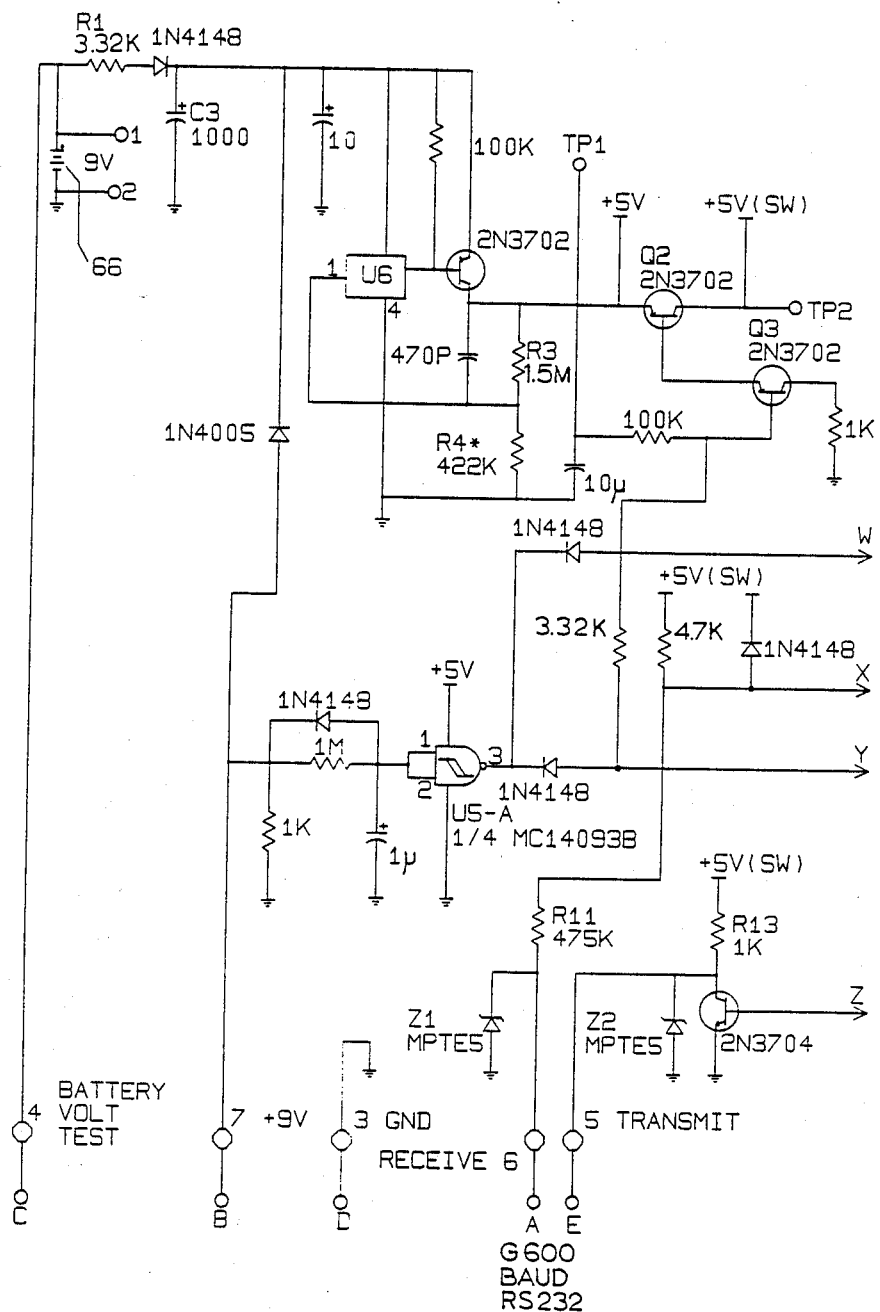
FIGS. 3a and 3b are together a circuit diagram of the electronic circuit of the recording ammeter.
Figure 3B:
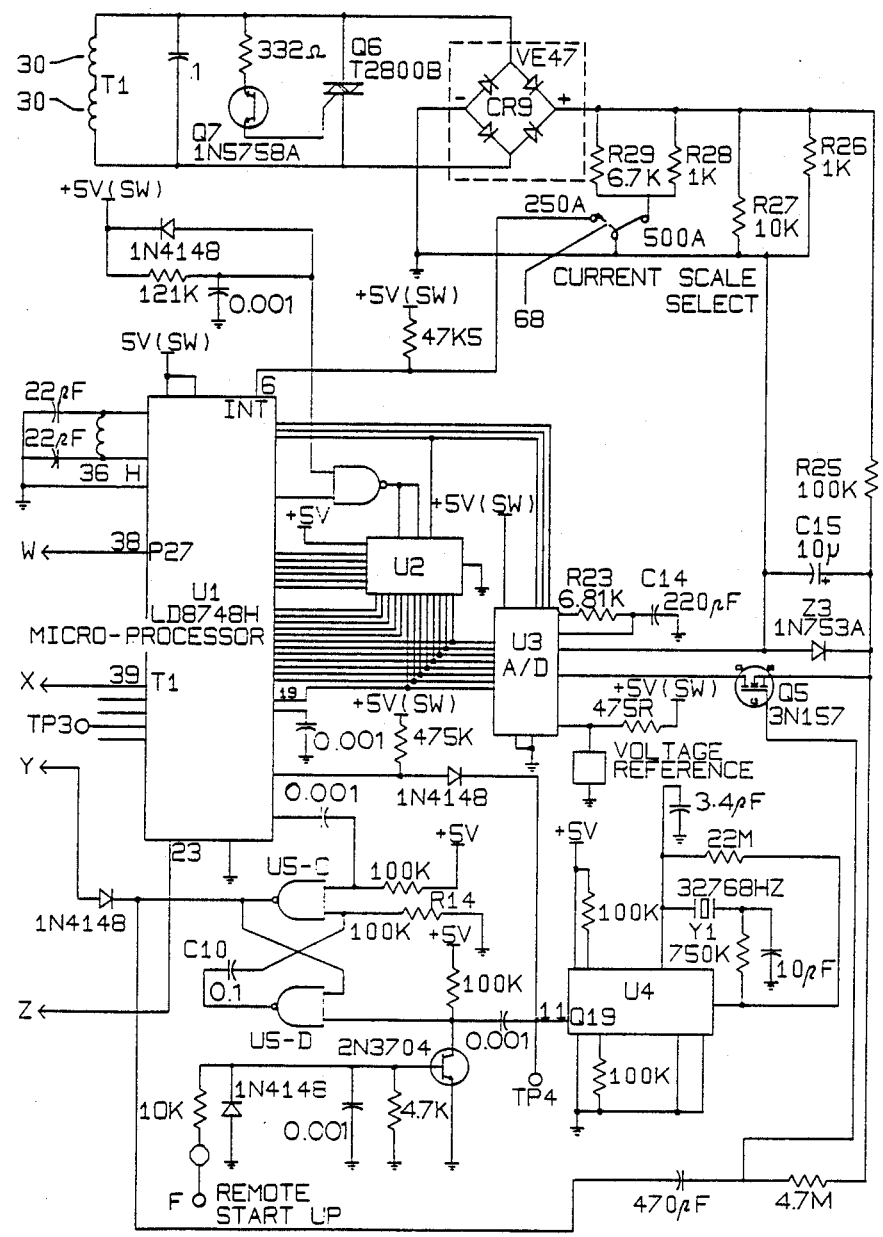

Referring now particularly to FIGS. 3a and 3b, a preferred electronic circuit for the ammeter of FIGS. 1 and 2, and usable also with the ammeter of FIGS. 7 and 8, consists of a microcomputer U1 connected to an external RAM module U2; in a typical application, a RAM of 2K bytes capacity is ample for approximately 20 days operation. The microcomputer requires a relatively large operating current (typically about 60 mA) and in order to conserve battery life it is turned on only briefly and only when required which, in this embodiment, is about 2 ms every 16 seconds when recording, or else 2 ms every 3 seconds if the visual display is connected, this being sufficient time to maintain the display. Thus, the microcomputer is normally only switched on every 16 seconds for a period of 2–5 ms and the respective power supplies thereto are therefore designated as +5 V (SW) to indicate that they are intermittent. The RAM unit U2 is constantly powered to maintain the information stored therein. Power for the microcomputer and the related circuitry is taken from capacitor C3 which is charged through a resistor R1 from a high capacity 9 V battery 66 when the microcomputer is switched off. Voltage regulation is provided by module U6 and is set at 5.1 V as determined by the voltage divider chain R3 and R4. The supply to the microcomputer and to an analog/digital converter U3 is switched by means of transistors Q2 and Q3, these transistors being turned on either by the flip-flop U6 or by a NAND gate U5-A whose input is tied to pin B of the external connector where the external power is applied. The NAND gate has a one second delay to allow time for good connection to the connector.

The circuit also contains a real time clock consisting of a 32,768 Hz crystal oscillator Y1 whose output is divided down by divider U4 to provide in a negative-going transition every 16 seconds at pin 11 thereof. This transition sets a flip-flop consisting of the two NAND gates U5-C and U5-D which turns on the microcomputer. The microcomputer increments a seconds counter by 16 seconds units and updates a minute-ofday counter and a day-of-year counter, these counter values being stored in the RAM during power down.

The clock consists of three counters, one of which keeps track of the day of the year, one counts the minutes of the day and the third keeps track of seconds. The first two are programable and the seconds counter is reset to zero whenever the time is reprogrammed. The minute of the day and day of the year counters can be programmed.

Alternatively, the flip-flop U5-C and U5-D can be set by an externally applied pulse provided at pin F for remote start up of the device. The flip-flop will be reset by a negative-going transition transmitted at pin 19 of the microcomputer. If not reset in this manner, it will reset unconditionally after a period of 10 ms, the time delay provided by the combination of resistor R14 and capacitor C10.

The microcomputer is turned on in one of three ways, each determining a particular mode of operation, namely:

(1) A pulse is sent every 16 seconds from the real time clock signalling an "update time mode" operation.

(2) A pulse on pin F is sent every 3 seconds from the external display module if connected to the ammeter resulting in "display mode" operation.

(3) When a suitable external voltage is applied to pin B of the outside connector resulting in an "output mode" operation.

In the "update time mode", which is the normal program of operation of the device, the microcomputer updates the date and time and takes a current measurement every 16 seconds. Over a 15 minute period, either 56 or 57 samples are taken and totalled. At the end of each 15 minute period, at 0, 15, 30 or 45 minutes after the hour, the average is calculated and stored in memory with the newest data overwriting the oldest data. The normal time required to update the clock and take a current measurement is about 2 ms, while the time required every 15 minutes to calculate the average and store it in memory is about 5 ms.

Current transducer T1 consisting of the coils 30 produces an A.C. signal that is applied to a diode bridge CR9, which rectifies the signal and generates a corresponding D.C. voltage. The current range in which the ammeter operates is selected by a switch 68 (FIG. 3b), which either connects with resistor R26 and R27 for a 250 amp scale, or else connects resistors R28 and R29 across the resistors R26 and R27 to obtain a 500 amp scale. The microcomputer determines which setting is operative via an input port comprising pin 6 of unit U1. To prevent excessive input voltages due to an incorrectly selected current range, or fault level currents, a Diac Q7 conducts when the input signal is greater than 20 V to fire a Triac Q6, thereby shorting the current sensor. After being rectified, the signal is filtered by a resistor R25 and capacitor C15 and is limited to a maximum of 6 V by a zener diode Z3. The resultant voltage is then fed to the input of the analog/digital converter U3, producing a signal corresponding to the voltage level detected. Since the A/D unit U3 is powered down most of the time, an FET switch Q5 prevents the capacitor C15 from discharging into the device. The timing for the A/D converter U3 is determined by resistor R23 and capacitor C14, the converter beginning a sample when a write pulse is received from the microcomputer. After a conversion from analog to digital is completed, the digital code is read by the microcomputer and stored in the RAM unit together with the information corresponding to the minute-of-day and day-of-year.

After sufficient information has accumulated, the device is removed from the power line and may then be connected to a computer via port AE. With the device powered externally, determined by pin 38 of microcomputer U1, it will output the contents of the memory on serial output port pin 23. The resistor R13 and transistor Q4 are used to generate the required zero and +5 V signals, while a transzorb Z2 provides transient protection. Input to the microcomputer occurs at test port T1 (pin 39) with resistor R11 providing current limiting and a zener diode Z1 providing transient protection.

Figure 4A:
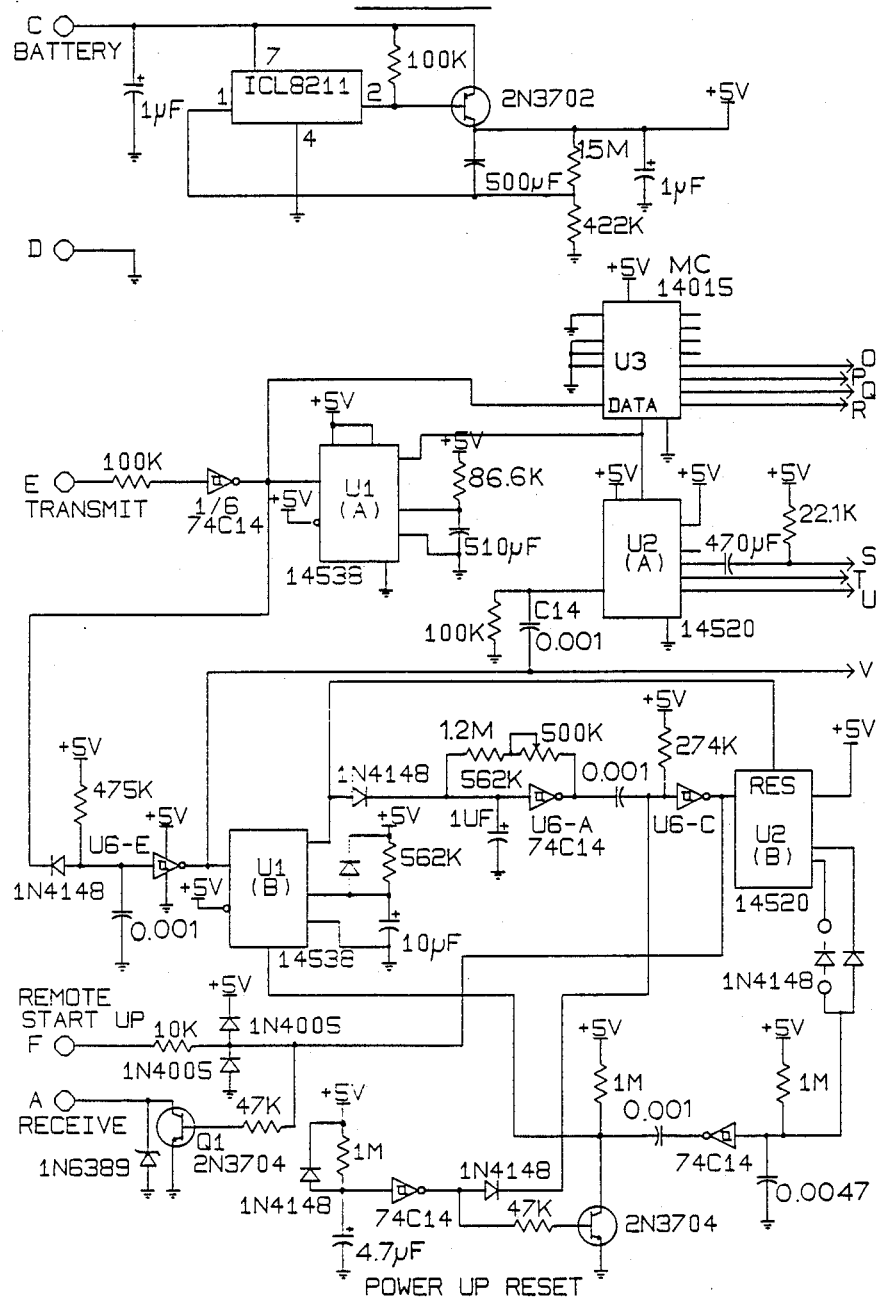
FIGS. 4a and 4b are together a circuit diagram of the electronic circuit of a display module for use with the recording ammeter.
Figure 4B:
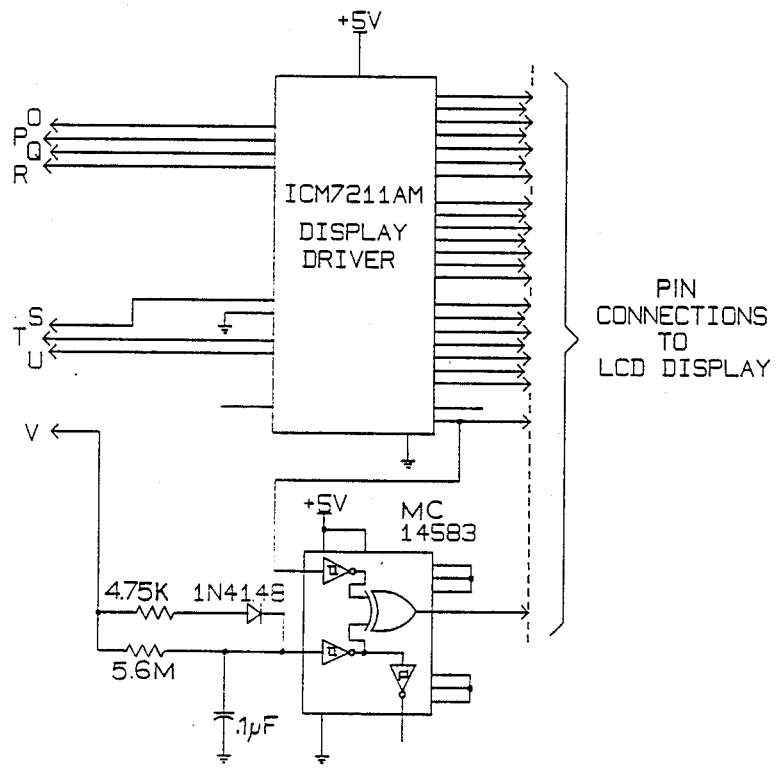

When the display module 44 is to be used with the embodiments of FIGS. 7 and 8, or when it is connected to the ammeter of FIGS. 1 and 2, the display circuitry shown in FIGS. 4a and 4b takes control of the microcomputer in between normal current samples taken every 16 seconds. The display information is sent to the display via the transmit port using pulse width modulation for each bit. When the display is first connected to the ammeter, the logic is reset. The display logic waits until the ammeter takes a normal 16 second current sample. The display shows 8's while waiting. When the transmit port goes HI (terminal E of the connector) indicating that the ammeter is powered up and a current sample is being taken, monostable flip-flop U1-B is set, thus starting oscillator U6-A. The monostable has such a long time delay that it acts as a latch. The oscillator produces four 300 $\mu$s pulses on the output of U6-C, which are 3.2 seconds apart. These pulses are output on terminal F setting the latch in the ammeter thereby powering up the microcomputer. The receive port, terminal A, is shorted during these four pulses by transistor Q1 to indicate to the microcomputer that the display initiated the power up and a display update is required. The pulses are also fed to counter U2(B) which resets latch U1(B) and the counter after four pulses.

When the microcomputer in the ammeter is powered up by the display, it takes a sample and outputs the display code on the transmit port (terminal E). The display code consists of twelve bits, 4 per digit, each bit being 100 $\mu$s long. A "zero" bit is LO for 33.3 $\mu$s and HI for 66.7 $\mu$s, whereas a "one" bit is LO for 66.7 $\mu$s and HI for 33.3 $\mu$s. A 50 $\mu$s one-shot U1(A), fires every time the transmit signal goes LO. After the one-shot times out, the transmit signal is clocked into the shift register. After four shifts, Q1 of counter U2(A) will go LO, writing the code for one digit into the display driver's memory, as addressed by Q2 and Q3. The other two digits are stored in the display driver's memory in the same manner. The counter, U2(A), is reset by a pulse generated by capacitor C14 when the transmit line goes HI, just before the display code is sent.

Figure 5A:
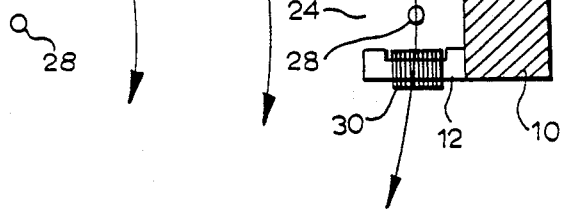
FIGS. 5a and 5b illustrate the preferred manner in which the coils of the ammeter are oriented relative to the power line conductor.
Figure 5B:
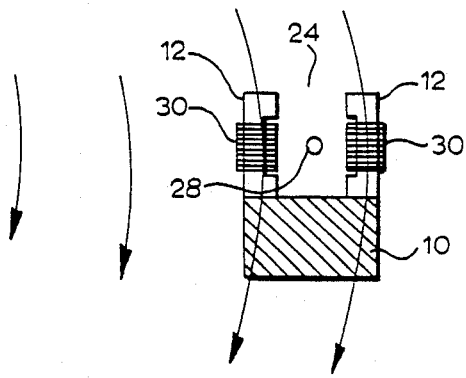
Figure 6:
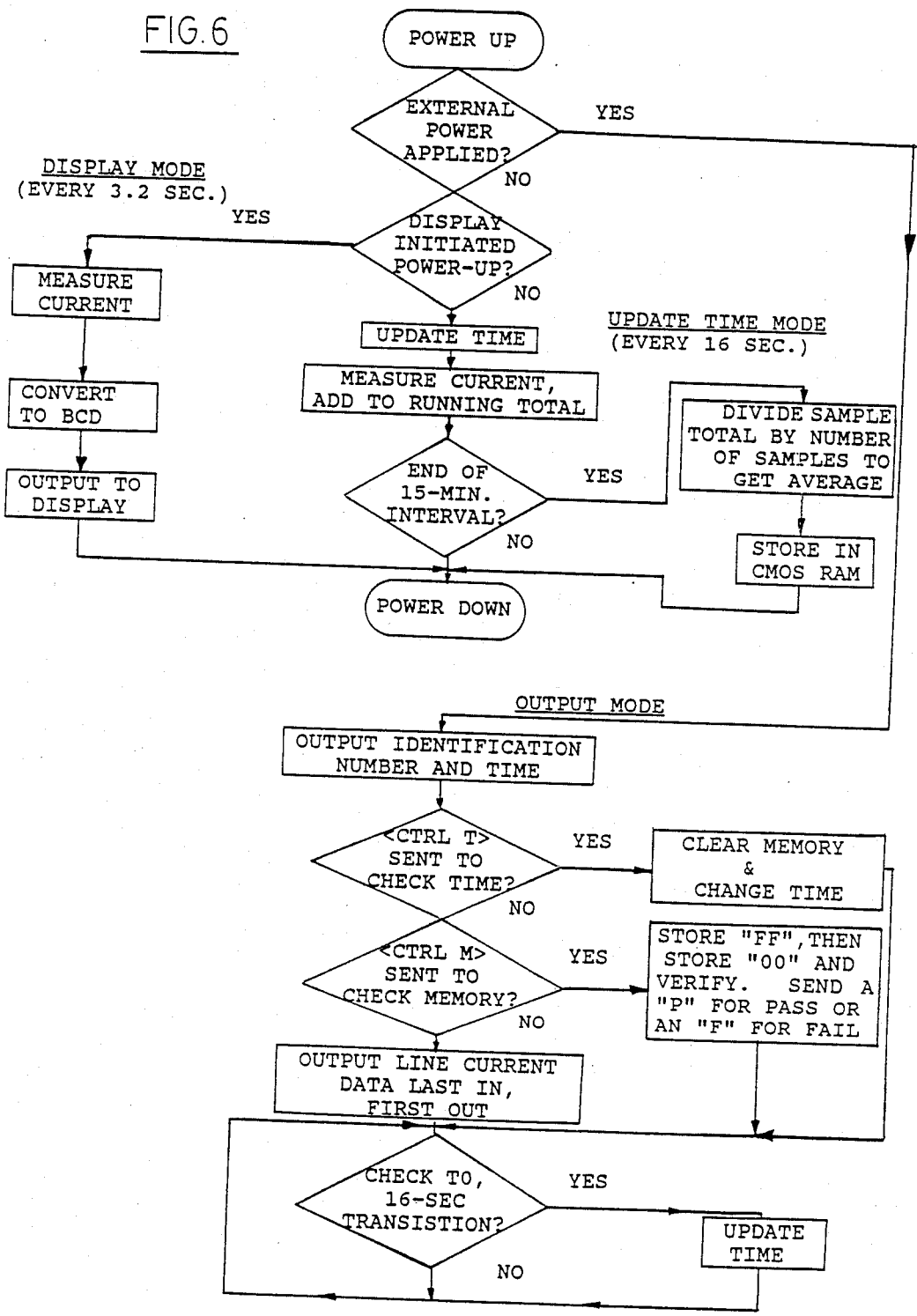
FIG. 6 is a flow chart showing the mode of operation of the recording portion of the ammeter.

The apparatus should be mounted on a relatively straight section of the conductor, keeping it away from the nearby conductors where possible, especially ones carrying high current, since one of the main sources of possible error is the presence of magnetic fields produced by these nearby current carrying conductors. In most cases, these errors are negligible as long as the conductors are at least 1.5 m (5 feet) away, regardless of how the device is mounted. If the coils of the transducer are perpendicular to the magnetic lines of force as shown in FIG. 5a, the effect of the field of the external conductor on the two legs will approximately cancel. In the configuration of FIG. 5b, since the cores are wound in opposite directions, there would be no effect in a uniform field. However, in this case one leg is closer to the external conductor than the other, and therefore the induced currents are not equal, resulting in a net error. These errors are minimized by keeping the apparatus at least 45 cm (1.5 feet) away from the conductors carrying currents comparable to the one being measured, and by avoiding placing the device within 1.5 m (5 feet) of conductors carrying higher current. If this is not possible, the arrangement of FIG. 5a should be followed to keep errors as low as possible. In this industry errors of ±5% are acceptable and the coil/core arrangement of the invention has been made to have errors in the range ±1-2%, with additional errors occuring in the electronic circuit.

With the embodiments of FIGS. 7 and 8 the attitude of the support 10 on the stick 50 is adjusted as necessary, depending for example on whether the different lines are spaced from one another horizontally or vertically.

I claim:

1. An ammeter for mounting on an A.C. electric power line for measurement of the current passing in the power line, the apparatus comprising:
   (a) a support member;
   (b) two at least approximately C-shaped flux-concentrating magnetic cores each comprising a base portion and two arm portions mounted oppositely to one another on the support member, the cores being separated at all times from one another to provide a power line receiving air gap between them with corresponding arm portions thereof disposed opposite to one another to define between the said oppositely disposed arm portions two respective opposed separate permanent non-magnetic gaps through one of which the power line passes while mounting the ammeter on and dismounting the ammeter from the power line;
   (c) at least two opposed multi-turn inductive coils wound respectively on the cores and connected in series with one another;
   (d) measuring means connected to the said coils for measuring directly the current flowing therein, thereby obtaining a measurement representative of the current passing in the power line; and
   (e) means for locating the line within the power line receiving space at least approximately centrally between the two cores.

2. An ammeter as claimed in claim 1, wherein the said means for locating the line comprise clamp means on the support member adapted to engage the power line and to clamp to the power line with the power line in position passing through the said power line receiving space between the two cores.

3. An ammeter as claimed in claim 1, wherein the clamp means is clamped and unclamped by movement of an operating member having a loop for engagement by a live-line hooked stick for an operator to effect the said movement.

4. An ammeter as claimed in claim 1, and including current measuring and recording means mounted on the support member and electrically connected to the coils.

5. An ammeter as claimed in claim 4, and including means for economising in power consumption, comprising means for powering up the current measuring means at predetermined non-measuring fixed regular intervals for a measuring period, and powering down the current measuring means during the non-measuring intervals, while powering up the recording means during both the non-measuring intervals and the measuring periods.

6. An ammeter as claimed in claim 1, wherein the said means for locating the line comprise a closed-end slot within the support member and into which the line is passed to mount the ammeter on the line, the closed end of the slot being disposed at least approximately centrally between the two cores.

7. An ammeter as claimed in claim 6, wherein the portion of the support member including the said slot is removable from the remainder of the support member to permit substitution of support portions with slots of different sizes for use with power lines of respective different diameters.

8. An ammeter as claimed in claim 6, wherein the mouth portion of the slot is wider than the closed-end portion and tapers progressively smaller to the closed-end portion to facilitate mounting of the ammeter on the line.

9. An ammeter as claimed in claim 6, wherein the support member has a portion thereof pivoted to the remainder with the closed-end slot between them, the closed end of the slot being larger than the adjacent part of the slot, and the said pivoted portion being spring-urged to maintain the slot in a closed position of minimum size, the pivoted portion moving away from the remainder of the support member against the urge of the spring to permit the power line to pass through the said adjacent part of the slot into and out of its closed end.

10. An ammeter as claimed in claim 6, and including current measuring and recording means mounted on the support member and electrically connected to the coils.

11. An ammeter as claimed in claim 10, and including means for powering up the current measuring means at predetermined non-measuring intervals for a measuring period, and powering down the current measuring means during the non-measuring intervals, while powering up the recording means during both the non-measuring intervals and the measuring periods.

* * * * *